United States Patent
Partin

[19]

[11] Patent Number: 5,883,564
[45] Date of Patent: *Mar. 16, 1999

[54] MAGNETIC FIELD SENSOR HAVING HIGH MOBILITY THIN INDIUM ANTIMONIDE ACTIVE LAYER ON THIN ALUMINUM INDIUM ANTIMONIDE BUFFER LAYER

[75] Inventor: Dale Lee Partin, Ray, Mich.

[73] Assignee: General Motors Corporation, Detroit, Mich.

[ * ] Notice: This patent issued on a continued prosecution application filed under 37 CFR 1.53(d), and is subject to the twenty year patent term provisions of 35 U.S.C. 154(a)(2).

[21] Appl. No.: 710,125

[22] Filed: Sep. 11, 1996

Related U.S. Application Data

[63] Continuation-in-part of Ser. No. 228,766, Apr. 18, 1994, abandoned.

[51] Int. Cl.$^6$ ................................... H01L 43/00
[52] U.S. Cl. ..................... 338/32 R; 338/32 H; 360/113
[58] Field of Search ................. 338/32 R, 324; 257/425; 360/113; 324/252

[56] References Cited

U.S. PATENT DOCUMENTS

| | | | |
|---|---|---|---|
| 2,778,802 | 1/1957 | Lardson et al. | 252/62.3 GA |
| 3,321,384 | 5/1967 | Weider et al. | 257/425 |
| 3,852,103 | 12/1974 | Collins et al. | 338/32 R |
| 4,224,594 | 9/1980 | Anthony et al. | 338/32 R |
| 4,236,165 | 11/1980 | Kawashima et al. | 357/16 |
| 4,251,795 | 2/1981 | Shibasaki et al. | 338/32 R |
| 4,912,451 | 3/1990 | Sugiyama et al. | 338/32 R |
| 4,926,122 | 5/1990 | Schroeder et al. | 324/207.13 |
| 4,926,154 | 5/1990 | Heremans et al. | 338/32 R |
| 4,926,226 | 5/1990 | Heremans et al. | 357/27 |
| 4,939,456 | 7/1990 | Morelli et al. | 324/207.21 |
| 4,978,938 | 12/1990 | Partin et al. | 338/32 R |
| 4,981,341 | 1/1991 | Brandle, Jr. et al. | 350/377 |

(List continued on next page.)

OTHER PUBLICATIONS

Baltes et al, "Integrated Semiconductor Magnetic Field Sensors", *Proceedings of the IEEE*, vol. 74, No. 8, Aug. 1986, pp. 1107–1132.

Bougnot et al, "Growth of $Ga_{1-x}Al_xSb$ and $Ga_{1-x}In_xSb$ by Organometallic Chemical Vapor Deposition", *Journal of Crystal Growth* 77 (1986), pp. 400–407.

Chyi et al, "Molecular Beam Epitaxial Growth and Characterization of InSb on Si", *App. Phys. Lett.* 54 (11), 13 Mar. 1989, pp. 1016–1018.

Dobbelaere et al, "Growth and Optical Characterization of $InAs_{1-x}Sb_x (0 \leq x \leq 1)$ on GaAs and on GaAs–Coated Si by Molecular Beam Epitaxy", *App. Phys. Lett.* 55 (18), 30 Oct. 1989, pp. 1856–1858.

Du et al, "Molecular Beam Epitaxial GaInSbBi for Infrared Detector Applications", Ninth International Conference on Molecular Beam Epitaxy, Aug. 5–9, 1996, Malibu, California.

Heremans, "Solid State Magnetic Field Sensors and Applications", *J. Phys. D: Appl. Phys.* 26 (1993), pp. 1149–1168.

Jou et al, "Organometallic Vapor–Phase Epitaxial Growth and Characterization of the Metastable Alloy $InP_{1-x}Sb_x$", *J. Appl. Phys.*, vol. 64, No. 3, 1 Aug. 1988, pp. 1472–1475.

Gnezdilov et al, "Resonant Raman Scattering in InSb/$In_{1-x}Al_xSb$ Superlattices", *Physical Review B*, vol. 48, No. 11, 15 Sep. 1993, pp. 8442–8445.

(List continued on next page.)

*Primary Examiner*—Michael L. Gellner
*Assistant Examiner*—Karl Easthom
*Attorney, Agent, or Firm*—George A. Grove

[57] ABSTRACT

A magnetic field sensor is described that has a 0.25–0.6 micrometer thick magnetically active layer of very high electron mobility that consists essentially of epitaxial indium antimonide. The indium antimonide layer is disposed on a 0.03–1.0 micrometer thick buffer layer of $In_{1-x}Al_xSb$, where "x" is about 0.01–0.2, that is substantially lattice-matched to the indium antimonide active layer.

17 Claims, 3 Drawing Sheets

U.S. PATENT DOCUMENTS

| | | | |
|---|---|---|---|
| 5,038,131 | 8/1991 | Olk et al. | 338/32 R |
| 5,153,557 | 10/1992 | Partin et al. | 338/32 R |
| 5,184,106 | 2/1993 | Partin et al. | 338/32 R |
| 5,189,367 | 2/1993 | Lee et al. | 324/252 |
| 5,314,547 | 5/1994 | Heremans et al. | 147/33.1 |
| 5,385,864 | 1/1995 | Kawasaki et al. | 437/132 |
| 5,442,221 | 8/1995 | Mosser et al. | 257/425 |
| 5,453,727 | 9/1995 | Shibasaki et al. | 338/32 R |
| 5,486,804 | 1/1996 | Sokolich et al. | 338/32 R |
| 5,491,461 | 2/1996 | Partin et al. | 338/32 R |

OTHER PUBLICATIONS

Li et al, "Molecular–Beam Epitaxial Growth on InSb on GaAs and Si for Infrared Detector Applications", *J. Vac. Sci. Technol. B* 11 (3), May/Jun. 1993, pp. 872–874.

Liu et al, "Molecular–Beam Epitaxial Growth and Characterization of $Al_xIn_{1-x}Sb/InSb$ Quantum Well Structures", *J. Vac. Sci. Technol. B* 14(3), May/Jun. 1996, pp. 2339–2342.

Madelung et al, editors, "Semiconductors", vol. 17 of *Landolt–Bornstein—Numerical Data and Functional Relationships in Science and Technology,* 1982, p. 623.

Mani et al, "Temperature–Insensitive Offset Reduction in a Hall Effect Device", *Appl.Phys.Lett.* 64 (23), 6 Jun. 1994, pp. 3121–3123.

Oshima et al, "Initial Stages of Nanocrystal Growth of Compound Semiconductors on Si Substrates", *Journal of Electron Spectroscopy and Related Phenomena* 80 (1996), pp. 129–132.

Partin et al, "Growth on High Mobility InSb by Metalorganic Chemical Vapor Deposition", *Journal of Electronic Materials,* vol. 23, No. 2, 1994, pp. 75–79.

Partin et al, "Growth and Characterization of Indium Antimonide Doped with Lead Telluride", *Journal of Applied Physics,* vol. 71, No. 5, 1 Mar. 1992, pp. 2328–2332.

Rao et al, "Be, S, Si and Ne Ion Implantation in InSb Growth on GaAs", *Journal of Applied Physics,* vol. 69, No. 8, 15 Apr. 1991, pp. 4228–4233.

Rao et al, "Heteroepitaxy of InSb on Silicon by Metalorganic Magnetron Sputtering", *Applied Physics Letters* 53 (1), 4 Jul. 1988, pp. 51–53.

Teede, "Single Crystal InSb Thin Films by Electron Beam Re–Crystallization", *Solid–State Electronics,* vol. 10, 1967, pp. 1069–1076.

Uppal et al, "Transport Properties of Heterostructures Based on GaSb, InAs and InSb onGaAs Substrates", *Journal of Crystal Growth* 111 (1991), pp. 623–627.

MAGNETIC FIELD SENSOR HAVING HIGH MOBILITY THIN INDIUM ANTIMONIDE ACTIVE LAYER ON THIN ALUMINUM INDIUM ANTIMONIDE BUFFER LAYER

RELATED PATENT APPLICATION

This patent application is a continuation-in-part to my previously filed U.S. patent application Ser. No. 08/228,766, now abandoned, entitled "Indium Antimonide Alloys for Magnetic Field Sensors", which was filed Apr. 18, 1994. The teachings of the above mentioned U.S. Ser. No. 08/228,766 are hereby incorporated herein by reference.

FIELD OF THE INVENTION

This invention relates to improvements in magnetic field sensors that are of the indium antimonide type. It more particularly relates to very thin film alloys of indium antimonide for magnetic field sensors.

BACKGROUND OF THE INVENTION

Indium Antimonide (InSb) is widely recognized as being useful in magnetic field sensors, such as magnetoresistors, Hall Effect sensors (Hall sensors), and MAGFETS (magnetically sensitive field effect transistors). Indium antimonide magnetic field sensors can be used in a variety of magnetic field sensing applications, including position, speed and acceleration sensing (linear or angular), compass sensors, magnetic memory readout and control of brushless motors. While an emphasis of this invention is on automotive applications, the applicability is general.

Indium antimonide is particularly attractive for use in magnetic field sensors because it is a material that has exhibited high electron mobility in bulk form. High electron mobility is important because it provides high magnetic sensitivity. On the other hand, indium antimonide has a relatively low energy band gap, of about 0.18 electron volts at room temperature. This relatively low energy band gap gives it a relatively large intrinsic carrier density at room temperature. However, in addition, the relatively large intrinsic carrier density increases dramatically with increases in temperature. This effect tends to mask resistance changes in the indium antimonide due to changes in magnetic field.

Often such temperature-induced changes can be compensated by signal conditioning circuitry. However, with indium antimonide, the temperature-induced changes in conductivity, or resistivity, are so large that they are not readily accommodated by some of the usual types of signal conditioning circuitry. Accordingly, it is typical and preferable to stabilize the carrier density in indium antimonide with respect to temperature variations by doping it n-type, typically within a factor of about 10 of $3 \times 10^{17}$ cm$^{-3}$. Conventional indium antimonide magnetoresistors are usually doped in a narrower range between about $4 \times 10^{16}$ cm$^{-3}$ and $2 \times 10^{17}$ cm$^{-3}$. However, higher values may be optional for some embodiments of this invention as will be hereinafter described. Such doping increases the electron density to sufficiently higher levels that changes in intrinsic carrier density (due to temperature changes) become insubstantial compared to the dopant density, or are more accommodatable with the usual signal conditioning circuitry.

On the other hand, the resulting n-type doped material has a lower electrical resistivity, or higher conductivity, than is desired. A higher impedance device draws less current at a given voltage, and therefore dissipates less power for a given voltage bias. Alternatively, it provides a larger output voltage (change in voltage when the magnetic field changes) for a given current bias. This favors use of thin films of indium antimonide for magnetic field sensors, to obtain sensors of lower power consumption.

In the past, thin layers of indium antimonide were made by thinning down high quality bulk monocrystals. They were thinned down to layers of approximately twenty micrometers in thickness. Thinner layers were desired, for reducing series resistance of sensors made from such films. However, thinner layers were difficult to produce by thinning bulk crystals. This led to the more recent practice of growing a thin epitaxial film of indium antimonide on an insulating or semi-insulating gallium arsenide (GaAs) or indium phosphide (InP) substrate. The substrate is of high electrical resistance to minimize its non-magnetically sensitive conductivity, that is electrically in parallel with the magnetically sensitive conductivity of the epitaxial film. Such epitaxial films are typically grown to a thickness of only 2–5 micrometers. This increases film sheet resistance (film resistivity divided by thickness) by an order of magnitude over the thinned-down bulk crystal films. However, even then, such films still have had such a low sheet resistance that other techniques are used to increase total sensor resistance. For example, extensive serialization of magnetoresistor units has been used to obtain high sensor impedances, and the attendant low power dissipation.

In the case of magnetoresistors, a higher total resistance is obtained by integrating many series-connected rectangular magnetoresistor units into one sensor body. Typically, the body is an elongated mesa or line of indium antimonide. The mesa is a line of rectangular sensing units that are connected end-to-end, in series fashion. The mesa or line, i.e., the series-connected magnetoresistor rectangle units, can be as long as needed to obtain the desired total resistance. Usually, the line is sinuous or undulated in order to get the greatest length on a unit area of gallium arsenide or indium phosphide substrate material.

The individual magnetoresistor rectangles have been integrally formed in an indium antimonide elongated mesa strip, and concurrently integrally connected in series, by forming a plurality of transverse "shorting bars" along the length of the upper face of the mesa strip. The transverse "shorting bars" are ordinarily spaced a fixed distance apart, which forms a series of rectangles along the length of the mesa strip. In such a construction, net resistance in the resultant sensor is a function of the number of successive rectangles in the line.

In the past, increased sensor resistance was obtained by increasing the number of successive rectangles in the mesa or line. This, of course, increases line length, which can increase the size of the sensor in a unit area.

Alternatively, one or two electrical contacts may be added to the sides of a single rectangle and used to form a Hall effect sensor or a MAGFET sensor. A Hall effect sensor has four electrical contacts on four ends or sides of a substantially rectangular, square, or cross-shaped mesa. A MAGFET has one electrical contact on one side of a mesa and two on the opposite side. In the absence of a magnetic field, the electrical output current of a MAGFET is evenly divided between the two "opposite" contacts. In the presence of a magnetic field perpendicular to the plane of the mesa, more current flows out of one of the "opposite" contacts than through the other. In some silicon implementations of a MAGFET, an insulated gate is used to induce or control the density of current carriers between the contacts, so that the device functions as a MAGnetically sensitive Field Effect Transistor. One can make an indium antimonide "MAGFET" without the gate, by simply doping the indium antimonide film between the contacts. One can also gain additional functionality or control of an indium antimonide MAGFET by fabricating an insulated gate, as hereinafter described.

Such sensors may be used to measure the Hall effect voltage. This voltage increased with increasing magnetic field, is sensitive to the polarity of magnetic field, and is inversely proportional to the thickness of the active, or current-carrying, layer. Thus, it is desirable to make such sensors with a very thin active layer. The Hall effect voltage is also inversely proportional to the electron density in the active layer. Therefore, it is desirable to minimize the electron density in the active layer. However, the Hall voltage will be sensitive to temperature if the electron density is sensitive to temperature. Since indium antimonide and indium antimonide-rich alloys are narrow energy bandgap semiconductors, it is necessary to dope the active layer n-type in order to stabilize the electron density. Thus, many of the structures discussed here in connection with magnetoresistors are very well suited for Hall effect sensors and MAGFET sensors.

Having a large electron mobility in the active layer is also important for Hall effect sensors because it helps to reduce unintentional offset voltages which otherwise limit the minimum detectable change in magnetic field. However, the sensitivity to magnetic field in a Hall effect sensor is determined more by the areal electron density in the active layer, which needs to be minimized. Thus, it is important to make the active layer as thin and lightly doped as possible, and some compromise with reduced electron mobility is then incurred (with reduced thickness). However, one still must dope the active layer heavily enough n-type to stabilize the electron density over the operating temperature range, since otherwise the sensitivity to magnetic field varies. In view of these tradeoffs, for some applications electron mobilities of only about 30,000 $cm^2V^{-1}s^{-1}$ at room temperature are acceptable in order to reduce the active region thickness to values which may fall somewhat below 0.25 micrometer. On the other hand, the sensitivity of a magnetoresistor to magnetic field is approximately proportional to the electron mobility squared for small magnetic fields. This places a premium on maximizing electron mobility for magnetoresistors. The optimum film parameters for MAGFETs are intermediate between those of Hall effect sensors and those of magnetoresistors. Thus, the tradeoffs between thickness, doping, and mobility are slightly different for these various sensors, but only slightly.

As indicated above, indium antimonide has been of interest as a magnetic field sensor material because it can be made with a high electron mobility. High electron mobility is obtained reproducibly only if the indium antimonide is monocrystalline, and the indium antimonide is of high quality. By "high quality" I mean that there are few crystal imperfections, such as dislocations, and the like. For example less than about $3 \times 10^9$ $cm^{-2}$ threading dislocations is desirable. The density of misfit and threading dislocations is generally much larger near an interface with a large lattice mismatch.

When growing monocrystalline thin films on a substrate, high single crystal quality is obtained if the substrate, itself, is a high quality single crystal of the same or related crystal type and has approximately the same crystal lattice constant (as the film being grown). In general, the better the crystalline match, the higher the quality of the epitaxial layer that can be grown. In addition, for highest magnetic sensitivity, and lowest power consumption, the substrate is preferably electrically insulating. To satisfy these requirements, and still other requirements, prior magnetoresistor indium antimonide epitaxial films have been typically grown on high quality monocrystalline wafers of gallium arsenide (GaAs) or indium phosphide (InP). Their large energy band gaps mean that their intrinsic carrier densities are extremely low which facilitates making them electrically insulating. Indium phosphide may be preferred because it is a closer match in lattice constant to Indium antimonide. However, gallium arsenide may be preferred because of its lower cost.

Gallium arsenide and indium phosphide are both somewhat smaller in crystal lattice size than indium antimonide. For example, the lattice constant of indium antimonide is 6.479 angstroms at room temperature. The lattice constant of indium phosphide is only 5.869 angstroms. Indium antimonide has a lattice constant that is about 10% larger. The lattice constant of gallium arsenide is 5.654 angstroms, which makes the indium antimonide lattice constant about 14% larger. This is a significant mismatch. I consider a mismatch to be significant when there is a lattice constant difference in excess of 0.07 angstrom.

As a result, the first 0.5 micrometer of an indium antimonide layer heretofore epitaxially deposited on a gallium arsenide or indium phosphide monocrystalline substrate was strained, and therefore had significant crystal imperfections. As a result, the electron mobility within that first 0.5 micrometer of deposited indium antimonide was of low electron mobility. As indicated above, this provided low magnetic sensitivity. In order to obtain higher electron mobility, and the higher magnetic sensitivity that it provided, an additional thickness was grown. This provided other disadvantages.

It should be recognized that the first 0.5 micrometer of the film is electrically in parallel with the balance of the film. Accordingly, a sufficient additional thickness had to be grown to provide a discernable magnetically variable total film resistance. Ordinarily, a total indium antimonide film thickness of at least about 2 micrometers was needed. On the other hand, if the indium antimonide thickness exceeded about 5 micrometers, the sheet resistance decreased to such an extent that size and/or power consumption of the resultant sensor became undesirable.

In this invention, I provide a magnetic field sensor having a magnetically active layer substantially of indium antimonide, and in an active layer thickness of about 0.25–0.6 micrometer. However, in this invention, this small thickness has an electron mobility approaching that often recorded for bulk crystal forms of indium antimonide. In this invention, I have been able to consistently achieve room temperature electron mobilities of 35,000–40,000 $cm^2V^{-1}s^{-}$1, and even higher. Such a high mobility is obtained in such a small thickness because its composition is substantially pure indium antimonide, and because the small thickness is disposed on a special layer of monocrystalline indium aluminum antimonide. The special indium aluminum antimonide layer is, in turn, disposed on a monocrystalline substrate of the same crystal type. The special indium aluminum antimonide layer is of limited aluminum content and thickness, that provides ready assimilation into the indium antimonide crystal lattice, a crystal lattice closely matched with indium antimonide, and a relatively high sheet resistance. The result is an indium antimonide sensor layer of very high electron mobility and a sensor of increased magnetic sensitivity. In addition, the resulting sensor has such a high unit resistance that size of the sensor, and its attendant unit cost, can be reduced.

OBJECTS AND SUMMARY OF THE INVENTION

It is therefore an object of this invention to provide an improved magnetic field sensor.

Another object of this invention is to provide a method for making an improved magnetic field sensor.

An additional object of this invention is to provide a magnetoresistor having a very high mobility but high sheet resistance active layer on an even higher sheet resistance special buffer layer on a monocrystalline substrate.

A more specific object of this invention is to provide a magnetoresistor having a substantially indium antimonide active layer about 0.25–0.6 micrometer thick and having an electron mobility of at least about 35,000 cm$^2$V$^{-1}$s$^{-1}$ at room temperature. Mobilities this high are required to satisfy the automotive requirements that the mobilities be at least about 30,000 cm$^2$V$^{-1}$s$^{-1}$ at maximum operating temperatures of about 150 degrees Centigrade. It is recognized that some applications have much lower operating temperatures and that some require operation at 200 degrees Centigrade and higher.

The objects of this invention are obtained, starting with a generally lattice mismatched monocrystalline semiconductor wafer having a lattice constant (in angstroms) of at least about 5.4, preferably at least about 5.6, and most preferably about 5.9. A special buffer layer of indium aluminum antimonide, In$_{1-x}$Al$_x$Sb, where "x" is 0.01–0.2, preferably 0.03–0.15, is epitaxially deposited onto the upper surface of the monocrystalline wafer. A buffer layer with higher "x" value results in degraded electron mobility in the active layer, which limits its usefulness. The special indium aluminum antimonide layer has only a small molar proportion, about 0.5–10 mole percent, of aluminum, which correspondingly substitutes for about 1–20% of the indium mole in a binary indium antimonide (InSb) compound semiconductor. This also corresponds to 1–20% mole fraction of aluminum antimonide in indium antimonide. It more preferably has an aluminum content of the order of 1.5–7.5 mole percent. This amount of aluminum raises the energy band gap of the resulting In$_{1-x}$Al$_x$Sb, over that of substantially pure InSb, without causing much lattice mismatch with indium antimonide. If the thickness of the special In$_{1-x}$Al$_x$Sb buffer layer is kept small, about 0.03–1.0 micrometer, the special buffer layer can have a high sheet resistance. As is known, the impedance of the buffer layer is not magnetically sensitive and is electrically in parallel with the magnetically sensitive resistance of the active layer. Accordingly, if impedance of the buffer layer is kept high, relative to the active layer, the magnetoresistor, Hall effect device, or MAGFET device, will show greater change in impedance with change in applied magnetic field. In other words, the resulting sensor is more magnetically sensitive.

An active layer of indium antimonide, in a special thickness range of about 0.25–0.6 micrometer, optimizes the electron mobility in this layer and yet provides such a small thickness that it can have appreciable sheet resistance. The net result of this low thickness and the low thickness of the buffer layer is that a smaller semiconductor area can provide the same resistance, which reduces cost of the resultant device.

Indium antimonide has a lattice constant of about 6.479 angstroms. The indium aluminum antimonide composition contemplated in this invention would have a substantially stress free lattice constant of at least about 6.41 angstroms and an energy band gap of about 0.2 eV or more at room temperature.

Other objects, features, and advantages of this invention will become more apparent from the following description of preferred embodiments thereof and from the drawing.

DETAILED DESCRIPTION

Figure 1:
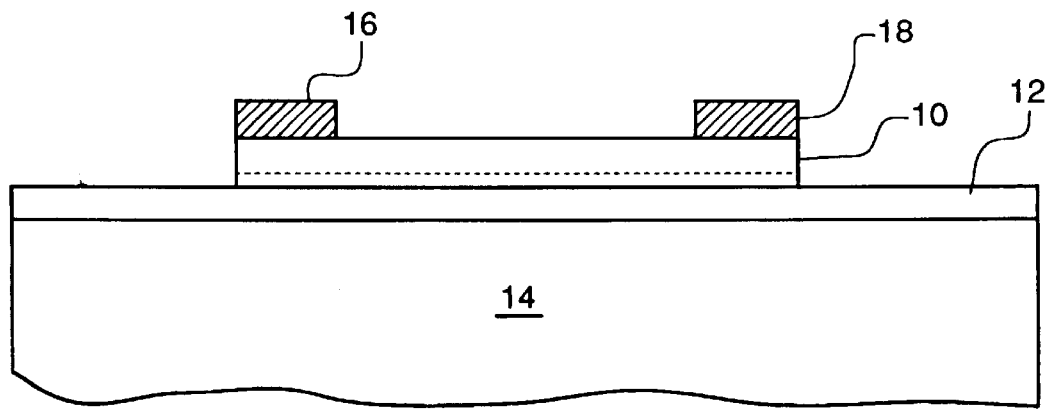
FIG. 1 shows a diagrammatic sectional view of a magnetoresistor made in accordance with this invention.

Reference is now made to FIG. 1, which shows a magnetoresistor that comprises a rectangular monocrystalline indium antimonide mesa layer 10 that is epitaxially deposited on layer 12. The right and left opposite edges of the upper surface of layer 10 have metal electrodes 16 and 18 formed thereon. The interface between layer 12 and layer 10 may be abrupt or may be graded. Mesa layer 10 serves as the magnetically sensitive, or "active" layer, of the magnetoresistor. In this invention layer 10 is a special layer of indium antimonide, with its special characteristics being hereinafter described.

Layer 12 is a special epitaxially deposited monocrystalline layer consisting essentially of indium aluminum antimonide, with the special characteristics of layer 12 being hereinafter described. Layer 12 serves as a "buffer" layer that is carefully matched in various ways to the active layer 10. The special buffer layer 12 is of In$_{1-x}$Al$_x$Sb (indium aluminum antimonide), where "x" is 0.01–0.2, preferably 0.03–0.15. It is epitaxially deposited onto the upper surface of the monocrystalline wafer 14.

Since the lattice constant of indium antimonide is 6.479 angstroms, the indium aluminum antimonide layer 12 should have a lattice constant no less than about 0.07 angstroms smaller, or about 6.41 angstroms, to avoid significant lattice mismatch. From FIG. 4, this corresponds to an aluminum antimonide mole fraction of about 20%, or "x"=0.2, in In$_{1-x}$Al$_x$Sb. If layer 12 has a lattice constant between about 6.3 and 6.41 angstroms, I consider it to be only "roughly" lattice matched to layer 10. This is a much less desirable condition, and leads to reduced electron mobilities. Pragmatically, I see no good reason for using "x">0.2 in layer 12. However, I recognize that one may choose to use "x">0.2 if the higher aluminum content can be readily produced and a given application does not require highest mobility.

As can be seen, the indium aluminum antimonide special buffer layer 12 has only a small molar proportion, about 0.5–10 mole percent, of aluminum, which correspondingly substitutes for about 1–20% of the indium mole fraction in a binary indium antimonide (InSb) compound semiconductor. This substitution produces a ternary compound semiconductor In$_{1-x}$Al$_x$Sb having a lattice constant of about 6.41 or more, and about 6.427 angstroms or more if the aluminum content is of the order of 1.5–7.5 mole percent. This amount of aluminum raises the energy band gap of the resulting $In_{1-x}Al_xSb$, over that of substantially pure InSb, without causing much lattice mismatch with indium antimonide. Energy band gap is raised to about 0.2–0.6 eV or more but lattice constant remains close to that of indium antimonide. If thickness of the special $In_{1-x}Al_xSb$ buffer layer 12 is kept small, about 0.03–1.0 micrometer, the special buffer layer 12 can still have a high sheet resistance, even for very small values of "x".

Impedance of the buffer layer 12 is not magnetically sensitive, and is electrically in parallel with the magnetically sensitive resistance of the active layer 10. Accordingly, if impedance of the buffer layer 12 is kept high, relative to the active layer 10, the resultant magnetic field sensor they form will show greater change in impedance with change in applied magnetic field. In other words, the resulting sensor is more magnetically sensitive.

Layer 12 could be made thicker than 1.0 micrometer, such as 2 micrometers, but this is highly undesirable because of the cost of growing the additional thickness of layer 12, and because of the reduced impedance of layer 12, especially at elevated operating temperatures of 150 to 200 degrees Centigrade and with aluminum antimonide mole fractions at the low end of the specified range. Furthermore, as hereinafter amplified, layer 12 may be doped p-type to increase its sheet resistance, since holes have much lower mobility than electrons in indium antimonide-rich alloys.

The indium aluminum antimonide semiconductor material of layer 12 can be considered to be an alloy. It may be a conventional "random" alloy in which Al atoms are randomly substituted for In atoms on the In sub-lattice of InSb. However, these alloys may also be non-random pseudoalloys, which are also commonly referred to as digital alloys or short period superlattices. In such alloys, layers of two materials are alternately grown on such a small distance or thickness scale that they act like alloys more than like two dissimilar materials. The repeat distance or periodicity is in the range of about 10–200 angstroms. For example, an $In_{1-x}Al_xSb$ alloy may be composed of alternating layers of AlSb and InSb, in which one or two monolayers of AlSb are alternated with many monolayers of InSb. A variant of this would-be for a few monolayers of $In_{1-y}Al_ySb$ to be alternated with many monolayers of InSb. In either case, the concentration of AlSb may be very large within a layer, but the average AlSb concentration, averaged over one or more periods, is less than about 20 mole percent, to provide the desired average aluminum proportion of less than about 10 mole percent. Use of these digital alloys is somewhat more difficult from a growth point of view, but can be advantageous, e.g., in minimizing interactions between indium and aluminum compounds in the gas phase during growth of layer 10 by metal organic chemical vapor deposition. It is noted that $In_{1-x}Al_xSb$ superlattices have been reported, without any transport data. (See, for example, V. P. Gnezdilov, D. J. Lockwood and J. B. Webb, Physical Review B, Volume 48, p. 8442 (1933)).

For completeness, it should be recognized that one may find reasons for wanting to add small amounts of other alloying elements to ternary alloy $In_{1-x}Al_xSb$ in forming layer 12. I generally prefer not to. I prefer that layer 12 consist only of $In_{1-x}Al_xSb$, to simplify the growth process. However, I understand that one may find many reason s to add small amounts of other elements to $In_{1-x}Al_xSb$ without significantly departing from the advantages one achieves with substantially pure $In_{1-x}Al_xSb$. However, if any other alloying elements are added, such as bismuth or thallium, they should not lower lattice constant of the resulting compound to less than about 6.3 angstroms, or produce an energy band gap of less that about 0.2 eV. As a rule of thumb, such additions should not exceed about 1–2 mole percent.

There is one known and significant exception to the above comment about limiting the addition of other alloying elements to 1–2 mole percent. Arsenic can be a useful addition to the indium aluminum antimonide in layer 12 when layer 12 is produced by MOCVD. This addition is counter intuitive, since FIG. 4 indicates that adding arsenic reduces the energy band gap of the alloy and increases the lattice mismatch between layer 12 and layer 10. However, I find that it is difficult to incorporate aluminum into indium antimonide using the metal organic chemical vapor deposition (MOCVD) growth technique. On the other hand, adding some arsenic (from a source such as arsine gas) helps increase aluminum incorporation. I have further found that if the mole fraction of arsenic in layer 12 is roughly comparable to or smaller than that of aluminum, then the net effect will be to increase the energy band gap without detrimentally reducing lattice constant. I consider the resulting quaternary alloy to consist essentially of indium aluminum antimonide, since the properties of the alloy are dominated by the aluminum content, not the arsenic content. As a variation, a short period superlattice of AlAs/InSb may be used, where the thickness of each AlAs layer is limited to one of two monolayers. In such thin layers, which are alternating with thicker indium antimonide layers, the resulting composite material acts like an alloy, and is chemically stable. This latter material is also considered to consist essentially of indium aluminum antimonide for purposes of this invention.

The special buffer layer 12 is of monocrystalline semiconductor material that was epitaxially deposited onto a monocrystalline wafer 14. Wafer 14 is of a monocrystalline semiconductor material having the same or related crystal structure as the semiconductor material of layers 10 and 12. However, it also has an energy band gap of at least about 1.1 eV or 0.66 eV (for example, silicon or germanium, respectively, which have the diamond crystal structure), and preferably at least about 1.3 eV. (for example, gallium arsenide and indium phosphide, both of which have the zinc-blende crystal structure). In addition, wafer 14 should have a lattice constant of at least about 5.4 angstroms (for example, silicon or gallium phosphide). Preferably, it would have a lattice constant of at least about 5.65 angstroms (for example, germanium or gallium arsenide), and even more preferably at least about 5.9 angstroms (for example, indium phosphide). Also each of layers 12 and wafer 14 are not necessarily homogeneous, as hereinbefore and hereinafter described. Indium phosphide is preferred as a substrate wafer material because its lattice constant is closest to that of indium antimonide. As indicated above, indium antimonide monocrystal have a lattice constant of about 6.479 angstroms. The indium aluminum antimonide alloy monocrystals contemplated in this invention generally have a lattice constant of at least about 6.41 angstroms and an energy band gap of about 0.2 to 0.6 eV or more at room temperature. Accordingly, the highest electron mobility is obtained on indium phosphide substrate wafers. Thus, best results in this invention are attained on indium phosphide wafers. However, satisfactory results, and even comparable results, can be obtained with gallium arsenide wafers, especially if precoated with an epitaxial layer more closely lattice matched with buffer layer 12.

Figure 4:
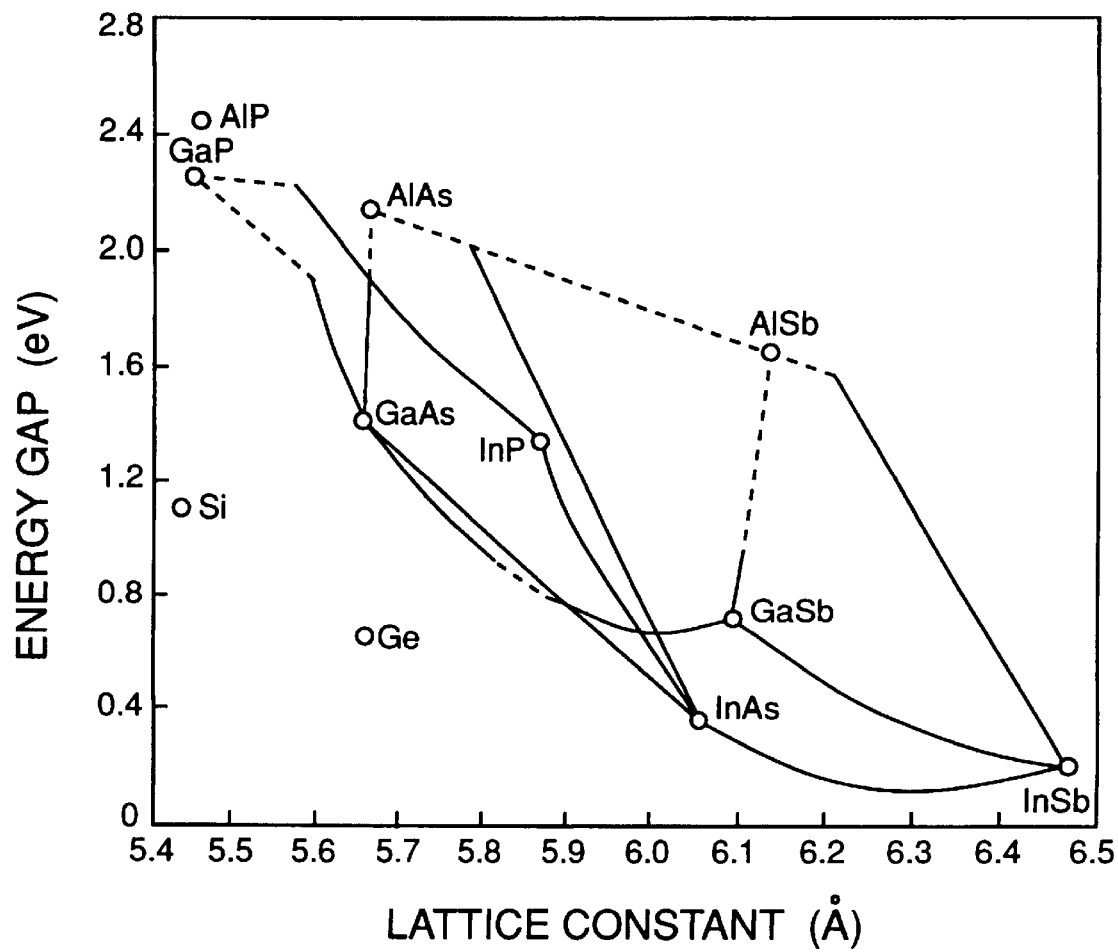
FIG. 4 shows a diagram in which lattice constant of various semiconductor materials is plotted against energy band gap.

If wafer 14 contains no precoating as purchased, I may prefer to use a thin layer 19 (see FIG. 1) of gallium antimonide as an initial coating on wafer 14, especially if very thin buffer and/or active layers are to be used. I find that nucleating the gallium antimonide layer 19 with a few monolayers of gallium is helpful but not essential in obtaining good crystal quality in the gallium antimonide layer. This is similar to the process which was previously described in D. L. Partin et. al., Journal of Electronic Materials, volume 23, pp. 75–79, 1994, which described a similar technique for nucleating indium antimonide on gallium arsenide using trimethyl indium which decomposed on the substrate surface to form indium. The thickness of the gallium antimonide layer 19 is non-critical since it tends to naturally grow lightly p-type with about $10^{16}$ to $10^{17}$ holes $cm^{-3}$ and hole mobilities of typically only several hundred $cm^2 V^{-1} s^{-1}$. Furthermore, its relatively high energy band gap of 0.69 eV at room temperature means that the intrinsic carrier density at 200 degrees Centigrade is still low enough to keep the sheet resistance large compared to that of layer 10. I find that a thickness of about 0.02 to 0.3 micrometers is adequate to grow high quality indium aluminum antimonide buffer layer 12 upon it. By "high quality layaer" I mean that the upper surface of layer 12 has few crystal imperfections, as generally evidenced by less than about $3 \times 10^9$ $cm^{-2}$ threading dislocations. A thickness of layer 19 above 0.3 micrometer is generally not harmful if the operating temperature is not too high. It is important to etch the gallium antimonide into a mesa pattern which is substantially the same as the mesa pattern in layers 12 and 10, to prevent lateral leakage currents from flowing through the gallium antimonide layer 19 which would otherwise tend to electrically short out adjacent mesa portions. However, pragmatically, the same lactic acid-nitric acid based etchants which are normally used to etch the active layer 10 and thus define the mesa in the indium antimonide also readily etch the indium aluminum antimonide layer 12 and the gallium antimonide layer 19. Thus, it would be rather difficult to not etch the same mesa pattern into all three layers. The use of a gallium antimonide buffer layer 19 between an indium phosphide substrate 14 and the buffer layer 12 is optional, with excellent electron mobilities obtained in the active layer 10 with or without layer 19. This also applies to the case of a composite substrate consisting of silicon with an insulating indium phosphide epitaxial coating on it. However, for gallium arsenide (as bulk crystal or on a silicon or germanium substrate), a gallium antimonide or indium phosphide layer 19 is helpful, and on a silicon or SOI composite substrate, it is very helpful. In a recent paper, Oshima et al., Journal of Electron Spectroscopy and Related Phenomena, volume 80, pp. 129–132, 1996, it was shown that gallium and antimony molecular beams can react on a silicon surface to form gallium antimonide isolated nanocrystals. This work did not explore growing a continuous gallium antimonide film, or discuss using such a film as a buffer layer for the growth of another semiconductor. Reference to FIG. 4 shows that as the lattice mismatch between the surface of the bulk or composite substrate 14 and the indium antimonide active layer 10 increases, it becomes more and more useful to have a thin layer 19 of intermediate lattice constant consisting of gallium antimonide or else of indium phosphide. It may also be noted that an indium phosphide bulk substrate is relatively expensive, a bulk gallium arsenide or germanium substrate is less expensive, and a silicon substrate is even less expensive. In general, use of a gallium antimonide or indium phosphide buffer layer 19 reduces the thickness of buffer layer 12 that needs to be used to obtain high electron mobility in layer 10. Finally, gallium antimonide layer 19 may be doped p-type with conventional dopants used for buffer layer 12 if desired, but this is optional since, as mentioned earlier, it tends to grow naturally p-type. While it is important to etch the mesa pattern into layer 19 if it consists of gallium antimonide, it is generally unnecessary to do so if layer 19 consists of high resistivity indium phosphide, although this is an option. Precoating should be especially considered for silicon and germanium wafers.

Alternatively, wafer 14 could be a monocrystalline ternary compound semiconductor such as indium gallium arsenide. Still further, it could be a composite substrate such as a silicon or germanium wafer having an epitaxial gallium arsenide or indium phosphide surface layer thereon, upon which layers 10 and 12 of this invention are deposited. Joseph P. Heremans, Louis Green and I disclose depositing an indium antimonide active layer directly on the latter type of substrate in U.S. Pat. No. 5,491,461. Accordingly, where I refer to a substrate wafer for use in this invention, I mean to include not only homogeneous substrate wafers but also substrate wafers that have one or more layers thereon that make them useful, and particularly more useful, in this invention. This would include a compound semiconductor layer on elemental semiconductors, such as a gallium arsenide layer on a germanium or silicon wafer or on a silicon-on-insulator (SOI) silicon wafer, which is explained below.

However, it would also include one or more compound semiconductor layers on a compound semiconductor wafer, as for example surface layers on a gallium arsenide wafer or indium phosphide wafer. In this latter connection, one might alternatively choose to substitute a ternary compound semiconductor, such as aluminum gallium arsenide, for the binary compound semiconductor (gallium arsenide) layer on the silicon or germanium wafer of the aforesaid U.S. Pat. No. 5,491,461. In such instance, the layer on the surface of the silicon or germanium wafer would have a larger energy band gap than gallium arsenide, as is shown in FIG. 4. Hence, such a layer would have a lower intrinsic conductivity. As indicated above, it is desirable that layer 12 have a higher sheet resistance than layer 10. In order to further increase the resistivity of an aluminum gallium arsenide layer, one could dope it with a deep level impurity such as oxygen, iron, chromium, or the like. The result would be a composite wafer of reasonably high resistivity, and closer matching in lattice constant to indium aluminum antimonide than is silicon. Such a substrate wafer may be desired, for example, where reducing the cost of the substrate wafer is of great concern. Other intermediate layers, including a thin film of monocrystalline silicon on top of an insulating silicon oxide layer on top of a monocrystalline silicon substrate (SOI) are also described in the above-mentioned U.S. Pat. No. 5,491,461. The oxide layer prevents current from flowing into the thick silicon substrate, which has a relatively low sheet resistance because of its thickness. Therefore, the buffer layer of the present invention may be grown directly upon the thin silicon film. Whether a bulk silicon wafer is used, an SOI wafer, or a silicon wafer coated with a gallium arsenide or indium phosphide buffer layer, it is still advantageous to use a gallium antimonide buffer layer 19 before depositing the indium aluminum antimonide buffer layer 12. If so used, the mesa pattern should extend through the gallium antimonide layer.

As indicated above, in this invention, active layer 10 consists essentially of indium antimonide (InSb), with buffer layer 12 consisting essentially of indium aluminum antimonide ($In_{1-x}Al_xSb$) that is substantially lattice matched with indium antimonide. By lattice matched, as hereinafter defined, I mean that the lattice constants are almost the same, i.e., differ only slightly. I appreciate that indium antimonide (InSb) is widely recognized as being useful in forming active layers in magnetic field sensors, such as magnetoresistors, Hall Effect sensors (Hall sensors), and MAGFETS (magnetically sensitive field effect transistors). However, forming satisfactory sensors with deposited thin films of indium antimonide has not been an easy task. Accordingly, much recent work has shifted away from using binary indium antimonide for active layers. In this invention, I shift back to using indium antimonide as active layer 10, but provide it in a special way. This way is special for several reasons. Among them is that layer 10 is of a particular thickness range designed to provide very high electron mobility, that approaches that generally available only with bulk crystal forms of indium antimonide or with much thicker indium antimonide epitaxial films with the same doping level. Testing has shown that in very thin films, such a high mobility is now available within a much smaller indium antimonide thickness range than was previously possible on a lattice mismatched substrate 14. However, the actual thickness is quite small, which permits one to attain relatively high sheet resistances, and an attendant reduction in chip size for a given performance and/or cost. Moreover, this thickness is matched with the sheet resistance of layer 12, to yield a sheet resistance that is at least about an order of magnitude (factor of 10) higher than the sheet resistance of layer 12. This increases magnetic sensitivity even more than is inherently available from the increased electron mobility of layer 10.

It should be recognized that electron mobility, and the associated magnetic sensitivity, decreases with increasing temperature. For automotive applications, it is well known that a typical requirement be that a device operate satisfactorily across a temperature range of −40 to +150 degrees Centigrade. In some recent applications, a requirement for satisfactory operation up to 200 degrees Centigrade may apply. To obtain the magnetic sensitivities required at temperatures of about 150 degrees Centigrade and even higher, an electron mobility of at least about 30,000 $cm^2V^{-1}s^{-1}$ can be needed. In order to achieve such high mobilities at such high temperature, one needs to start with an active layer that has a mobility of at least about 35,000 $cm^2V^{-1}s^{-1}$ at room temperature. In this invention, I have been able to consistently achieve room temperature electron mobilities of 35,000–40,000 $cm^2V^{-1}s^{-1}$, and even higher. It is achieved by forming the active layer substantially of the binary alloy InSb, instead of a ternary alloy, such as indium aluminum antimonide or indium gallium antimonide. It is also achieved while limiting the thickness of the indium antimonide layer to the thickness range of about 0.25–0.6 micrometer. This thickness range is matched to a thickness and composition of layer 12 to not only give these benefits but still other benefits. As indicated above, I prefer that layer 10 be composed of the substantially pure binary compound semiconductor indium antimonide. On the other hand, it is recognized that there may be reasons one may desire to include small amounts of impurities or additives, such as aluminum or gallium for indium, or such as arsenic or phosphorus for antimony, in molar proportions of up to about 1–3 mole percent, averaged over the indium antimonide alloy of layer 10. However, if present, such impurities or additives should not be used in molar proportions that will significantly raise or lower the energy band gap that is normal and expected for pure indium antimonide. Moreover, I have found that the presence of larger proportions of such additives tends to reduce room temperature electron mobility of the binary compound to levels below about 35,000 $cm^2V^{-1}s^{-1}$. That is, if the sum of the molar percentages of aluminum, gallium, arsenic and phosphorus in indium antimonide layer 10 is about 5 percent or more, the electron mobility is significantly reduced. This would, for example, correspond to 10 percent mole fraction of gallium antimonide in the absence of other alloy constituents in layer 10.

Accordingly, I prefer to avoid including such impurities or additives in layer 10, to avoid reduced mobility and decreased difference in sheet resistance from layer 12. Both results are objectionable from a magnetic sensitivity standpoint. It is important to make the sheet resistance of layer 10 be as low as is practical, compared to that of layer 12, based on power dissipation ratings desired for the sensor and to maintain high sensitivity to a magnetic field. Hence, optimum sheet resistance of layer 10 is a function of the sensor power consumption that can be tolerated, the sheet resistance of layer 12, and the magnetic sensitivity required of the sensor. It is to be noted that if sensitivity and sheet resistance of the layer 10 are high, the size of the semiconductor chip in the sensor can be reduced, which can produce an attendant reduction in sensor cost.

Also, it should not be overlooked that much of the more recent prior art looks to lattice matched tertiary and quaternary compound semiconductors in both the active and buffer layers for obtaining enhanced electron mobilities. In this invention, active layer 10 consists essentially of a simple binary compound semiconductor. The binary compound semiconductor is easier to deposit in high quality form than a tertiary or quaternary compound semiconductor. Thus, higher mobilities are more readily and consistently reproducible in layer 10. Magnetoresistor chips are thus more readily obtainable for another reason at higher sensitivities and/or lower cost.

It will be recognized that layer 12 functions as a buffer layer. Use of a buffer layer, to facilitate formation of thinner active layers is described in my earlier U.S. Pat. No. 5,184,106 Partin et al., which is incorporated herein by reference. However, U.S. Pat. No. 5,184,106 Partin et al. discloses the difficulty that existed in obtaining a buffer layer with a high enough energy band gap but not so high as to produce a significant crystal mismatch with the active layer. U.S. Pat. No. 5,453,727 Shibasaki et al. confirms that the prior U.S. Pat. No. 5,184,106 Partin et al. does not disclose a satisfactory buffer layer for a binary active layer of indium antimonide. U.S. Pat. No. 5,453,727 Shibasaki et al. discloses over 24 examples of buffer layer/active layer combinations. Ternary and quaternary alloys are used in all the buffer layers and many of the active layers, with some examples disclosing an active layer of the binary compound indium arsenide. None of the examples disclose alloys that will lattice match with an active layer of binary indium antimonide. Mobilities are reported in many of the Shibasaki et al. examples. Most of the reported mobilities are less than 20,000 $cm^2V^{-1}s^{-1}$, with a few being as high as 21,000 $cm^2V^{-1}s^{-1}$. I have found that to attain mobilities in excess of 35,000 $cm^2V^{-1}s^{-1}$, an active layer substantially of binary indium antimonide, not indium arsenide, is needed.

In this invention, I have recognized that if the buffer layer is kept thin, aluminum can in fact be used to form a ternary alloy that raises the energy band gap of indium antimonide enough to be useful in obtaining high sheet resistance while retaining close enough lattice matching to allow a thin active layer of indium antimonide to achieve room temperature mobilities in excess of about 35,000 $cm^2V^{-1}s^{-1}$.

In this invention, the composition of layer 12 provides significant semiconductor resistivity. Its thinness, combined with its increased resistivity, over that of binary indium antimonide, provides a useful sheet resistance of typically about 400 ohms per square at room temperature and at least about 200 ohms per square at 150 degrees Centigrade in the resultant sensor chip. On the other hand, layer 12 has a thickness that is large enough to provide a crystallographically adequate exposed surface upon which to deposit the substantially binary indium antimonide active layer 10. Accordingly, active layer 10 can be epitaxially deposited with few crystal defects, which results in the high electron mobilities referred to above. Also importantly, it is to be noticed that such mobilities are attained in a thin layer 10 of about 0.25–0.6 micrometer. This too provides high sheet resistances, which when used with the higher sheet resistances of layer 12, provide a sensor chip of lower power dissipation. As indicated above, this permits one to use smaller sensor chips, i.e., fewer serially connected rectangles, for a given power dissipation rating.

In this invention, I have found how to use a selected composition and thickness of the of the buffer layer to obtain extremely high mobilities from an active layer formed of a compound semiconductor that consists essentially of the simple binary semiconductor indium antimonide.

In this invention, active layer 10 is substantially of indium antimonide. Buffer layer 12 is of $In_{1-x}Al_xSb$, where "x" is about 0.01–0.2, and is about 0.03–1.0 micrometer thick. I recognize that others may elect to use more aluminum than what I prefer. With that in mind, I wish to state that furthest upper limit on the aluminum antimonide mole fraction, "x", in buffer layer 12 is one that will result in a lattice constant that is greater than about 6.3 angstroms (corresponding to "x"=about 0.5 in $In_{1-x}Al_xSb$) and that the energy band gap of the alloy must be smaller than that of the substrate. At the composition "x"=0.5, the energy band gap is about 1.1 eV, approximately equal to the energy band gap of silicon. Even though the energy band gap of gallium antimonide is 0.69 eV at room temperature, the energy band gap limitation of the indium aluminum antimonide alloy in layer 12 refers not to an optional, additional gallium antimonide buffer layer 19 but to the substrate under it. Aluminum antimonide mole fraction, "x", in buffer layer 12 which is greater than 0.2 may be useful in some applications requiring only low temperature operation, but is generally not preferred. Such buffer layers are only roughly lattice matched to indium antimonide, and yield reduced electron mobilities in layer 10. Thus, use of aluminum antimonide mole fractions in buffer layer 12 which are about 0.01–0.2 are preferred, and mole fractions of 0.03–0.15 are even more preferred.

Such epitaxial layers will have the same crystal structure as the active layer. By the same crystal structure, I mean that the materials of layers 10 and 12 each have a crystal lattice type that is zinc-blende. By substantially lattice matched, I mean that the materials forming layers 10 and 12 have stress-free lattice constants that are preferably within about 0.07 angstrom of one another. This residual lattice mismatch is at least partially and preferably totally accommodated by tensile and/or compressive strain in layers 10 and 12. Thus, few or preferably no additional dislocations are created in layer 10 beyond the threading dislocations which propagate upward from the top surface of layer 12 into layer 10. As previously indicated, less than $3\times10^9$ cm$^{-2}$ threading dislocations is preferable on a high quality surface. It is to be noted that if the thickness of layer 10 is made too small, surface depletion effects become significant, and quantum confinement effects become important, which increase the electron effective mass and therefore decrease the sensitivity of the sensor to magnetic fields. Since the sheet resistance also varies with the thickness of layer 10, there are tradeoffs to consider in choosing this actual thickness which depend upon the materials composition, doping level, defect density, strain, device layout, sensor operating temperature range, and required total resistance, power consumption and sensitivity.

As indicated above, it is contemplated that layer 10 be of a thickness of about 0.25–0.6 micrometer. The actual thickness of layer 10 that is needed within this range will be a matter of design choice. However, one factor to consider is the actual difference in lattice constant between layers 10 and 12, as previously discussed. Another is the crystal quality of the surface of layer 12 upon which layer 10 is to be deposited. The lower the deposition surface quality, the thicker the indium gallium antimonide has to be grown to get a high average crystal quality, and its desired attendant high electron mobility. While the thickness of layer 10 is restricted here to be no more than about 0.6 micrometer, one can always grow a somewhat thicker active layer and obtain a slightly larger electron mobility. However, I find that thicker active layers only slowly increase in electron mobility with increasing thickness, and that substantially thicker layers, such as one micrometer thick, have substantially lower sheet resistance, ultimately leading to a larger and more expensive sensor chip. Hence, I find that the optimum thickness range does not extend appreciably beyond 0.6 micrometer.

As indicated above, the crystal quality of the surface of layer 12 affects layer 10. It is therefore preferred to make the quality of the surface of layer 12 as high as is practical. To do that, of course, requires that the surface of wafer 14 be of high quality. High electron mobility is obtained reproducibly only if the indium antimonide is monocrystalline, and the indium antimonide is of high quality. As hereinbefore indicated, by "high quality" I mean that there are few crystal imperfections, such as dislocations, and the like on the wafer deposition surface. For example, less than about $3\times10^9$ cm$^{-2}$ threading dislocations is preferred.

The density of misfit and threading dislocations is generally much larger near an interface with a large lattice mismatch. Accordingly, in this invention, I use a buffer layer and avoid significant lattice mismatch between the buffer layer and the active layer. As background, I should point out that, if epitaxial growth is initially of reasonable quality, the thicker one grows a layer, the more its crystalline quality improves, until the last monolayer grown is of highest quality. It should also be noted that in this invention, the semiconductor material of layer 12 has a higher sheet resistance than the semiconductor material of layer 10. However, the layer 12 material generally has a lower sheet resistance than wafer 14. Accordingly, I wish to keep layer 12 as thin as is practical, to maximize sensor resistance parallel to active layer 10. On the other hand, the bigger the difference in lattice constant between layer 12 and wafer 14, and/or the poorer the crystal quality of the surface of wafer 14, the thicker layer 12 has to be. In general, with the usual quality now generally commercially available for gallium arsenide wafers, a high quality surface can be obtained on layer 12 if it is about 0.2–1.0 micrometer thick.

However, as indicated above, use of a gallium antimonide additional buffer layer 19, which has a lattice constant (about 6.10 angstroms) almost evenly dividing that of the gallium arsenide substrate 14 under it (5.65 angstroms) and that of the indium aluminum antimonide buffer layer 12 over it (roughly 6.45 angstroms), allows much of the lattice mismatch between substrate 14 and buffer layer 12 to be accommodated in a layer with reasonably large energy band gap and high sheet resistance. Since gallium antimonide is a simple binary compound, it is relatively easy to grow. Furthermore, while it may be doped p-type as is layer 12 to take advantage of the low mobility of holes in gallium antimonide to produce high sheet resistance, this is optional, since the material tends to naturally grow p-type. Use of a thin gallium antimonide layer, typically about 0.02 to 0.3 micrometer thick, permits the thickness of a subsequently grown buffer layer 12 to be as thin as 0.03 micrometer, and for electron mobilities in subsequently grown active layer 10 to attain about 35,000 $cm^2V^{-1}s^{-1}$ or more at room temperature. Use of somewhat thicker indium aluminum antimonide in layer 12, than this approximate minima of 0.03 micrometer, is still preferred to obtain a robust, high yield production process. That is, some allowance has to be made for the difference between what can be done in a laboratory and what can be done in a mass production environment. For example, allowance has to be made for the fact that, in a large production reactor, the thickness of a given layer on one wafer may not be exactly the same as its thickness on another wafer in the same growth run. Thus, even with a gallium antimonide additional buffer layer 19, the preferred thickness range of the indium aluminum antimonide layer 12 is about 0.1 to 0.5 micrometer. Similarly, the preferred thickness range of the gallium antimonide layer is 0.03 to 0.1 micrometer.

Once layer 12 has sufficient thickness to produce a high quality crystal surface on it, any additional thickness is objectionable because it reduces the sheet resistance of layer 12. Correspondingly, it should be recognized that smaller thicknesses can be used for layer 12, especially if wafer 14 is a composite wafer having a thin, high crystal quality surface layer more closely matching the lattice constant of layer 12 than gallium arsenide.

In a thin layer such as layers 10 and 12, resistance, $R_s$, measured in ohms per square, is given approximately by $R_s=(qtun+qTUp)^{-1}$ where q is the electron charge (1.602× $10^{-19}$ coulombs), u(U) is the electron (hole) mobility (in $cm^2V^{-1}s^{-1}$), n (p) is the electron (hole) density or concentration ($cm^{-3}$) and t(T) is the active (buffer) layer thickness (cm). Thus, for example, if $n=1\times10^{17} cm^{-3}$, $u=35,000$ $cm^2V^{-1}s^{-1}$, and $t=0.5$ micrometers, and un >> Up, then $R_s=35$ ohms per square at room temperature and a few times smaller at 200 degrees centigrade due to a high density of intrinsic electrons. Thus, if the length and width of a rectangular section of active region are equal (i.e., it is square), the resistance from one edge to the opposite edge of the square section would be 35 ohms. Furthermore, for given values of u and n, the sheet resistance of a thin layer with t<0.6 micrometer is several times larger than that of a thick layer which may be of the order of 2 micrometers thick. With such thinner layers, it is then possible to make a series-connected number of magnetoresistors with a given total resistance with a smaller number of elements which cover a smaller area than would be the case with thicker buffer and active layers. Note that these elements are generally not square in the case of magnetoresistors, but are usually rectangular with lengths less than their widths.

As noted above, an important requirement of the buffer layer 12 is that its sheet resistance be at least about 10 times, and preferably at least 30 times, that of the active layer 10. This may be accomplished by making the energy band gap of layer 12 large enough that the intrinsic carrier density is significantly reduced below that of InSb, e.g., preferably to less than $5\times10^{16}$ $cm^{-3}$ at the maximum operating temperature. Furthermore, layer 12 may be doped p-type, e.g., to $1\times10^{17}$ $cm^{-3}$, reducing its electron concentration to a low value. Since the hole mobility U in layer 12 is typically <500 $cm^2V^{-1}s^{-1}$, the sheet resistance of layer 12 may be as high as 1000 ohms per square at room temperature and over 100 ohms per square at 200 degrees Centigrade, depending upon the mobility of the residual electrons, and assuming that the thickness of layer 12 is 1 micrometer. Its sheet resistance can become even higher, as for example 2000 ohms per square at room temperature, if the layer thickness is reduced from 1 micrometer to about 0.5 micrometer. Making the sheet resistance of layer 12 as large as is practical is important. It will be recalled that an object of this invention is to make the active layer 10 of high sheet resistance, to reduce device size and/or cost. However, it should not be made so large that it becomes comparable to that of layer 12. This would degrade device sensitivity. Accordingly, this is another constraint on the minimum thickness for an active layer that can be tolerated in any given device design, even if electron mobilities greater than about 35,000 $cm^2V^{-1}s^{-1}$ are available in lesser thickness of active layer.

Also, note that, in the sample calculation of sheet resistance of layer 12 cited above, the layer 12 is doped substantially p-type. It is preferable for the p-type dopant concentration in layer 12 be reduced to a much lower value, such as $3\times10^{16}$ $cm^{-3}$ or even undoped, if this can be done without creating a density of electrons in layer 12 which is large enough to unacceptably lower its sheet resistance. For automotive applications, the maximum operating temperature is typically in the range of 70 degrees Centigrade to 200 degrees Centigrade. Since the intrinsic carrier density increases with temperature, higher operating temperatures make it more difficult to make the sheet resistance of layer 12 remain about a factor of 10 or more larger than that of layer 10. The minimum required operating temperature for automotive applications is typically −40 degrees Centigrade, which normally does not present such a problem. Small values of the aluminum concentration in the $In_{1-x}Al_xSb$ buffer layer, such as "x" about 0.01 or 0.03, may require higher levels of p-type doping, up to several times $1\times10^{17}$ $cm^{-3}$, and an optimal thickness of the buffer layer less than about 0.25 micrometer, depending on the maximum operating temperature.

Spaced parallel contact bars 16 and 18 are disposed as spaced ohmic contacts on the top surface of layer 10. As is known, it appears that the Fermi energy in InSb is pinned near its valence band edge at the surface of InSb. This is probably true of its dilute alloys as well, such as InSb-rich InAlSb. This means that layer 10 will be depleted of electrons near its top surface (i.e. upper surface in FIG. 1) for a depletion width or distance which increases as the inverse square root of doping density. At the lowest doping levels contemplated in this invention for layer 10, of about $3\times10^{16}$ $cm^{-3}$, this leads to a depletion depth of about 0.14 micrometer. This is a substantial fraction of even the maximum preferred thickness of layer 10. To offset this effect, a preferred approach is to heavily dope a very thin layer at the top surface of layer 10 as disclosed in U.S. Pat. No. 5,153,557, entitled Magnetic Field Sensor Contacts, by D. L. Partin and J. P. Heremans, since this also facilitates formation of low resistance contact between layer 10 and ohmic contacts 16 and 18. For example, if this thin layer is doped at $1\times10^{18}$ $cm^{-3}$, it will be fully depleted if its thickness is about 240 angstroms. However, it is generally desirable to make the thickness of this "contact layer" somewhat greater, typically in the range of 300 to 1000 angstroms if the dopant density is graded in this thickness range from about $1\times10^{17}$ $cm^{-3}$ to about 2 to $5\times10^{17}$ $cm^{-3}$ near the upper surface of layer 10. This depth of increased surface doping is because a portion of this surface layer is converted to oxide upon exposure to air, or may be chemically etched away upon exposure to acids or other chemicals used to prepare the surface for the deposition of ohmic contacts in some regions of the sensor structure. These ohmic contacts may serve as "shorting bars" or as end contacts to which leads may be bonded for ohmic contacts. Some of the contact layer may also be consumed by chemical reaction with ohmic contact materials. Thus this contact layer enhances ohmic contacts (decreases their resistance) where it is under such contacts, and serves the additional purpose in other regions of preventing surface depletion effects from removing a large number of electrons from the thin active layer. Doping would be with n-type dopants. The n-type dopants conventionally used are one or more of the Group VI elements tellurium, selenium and sulfur, and/or one or more of the Group IV elements silicon, tin or the like. I often prefer tellurium. The bulk of the middle thickness of layer 10, preferably about 40–80% of its thickness, would be doped to a lesser level of about $1 \times 10^{17}$ $cm^{-3}$, with the lower surface of layer 10 being preferably undoped for the first 200–1500 angstroms of its thickness. This technique of leaving a thin region of layer 10 undoped adjacent to layer 12, then doping the mid-region of layer 10 n-type, and then raising the donor concentration near the outer surface of layer 10 is roughly equivalent to grading the n-type dopant concentration over the whole thickness of layer 10 from a low level near the interface with layer 12 to a high level near the outer surface of layer 10. Note that there is a p/n junction between the p-type buffer layer 12 and the n-type active layer 10. Thus, there will be a space charge region near the heterojunction which is depleted of electrons and holes. This depletion of electrons in the active layer may be advantageous in cases of relatively large lattice mismatch, since this would reduce the electron density in a region of poor crystal quality.

The epitaxial layers 10 and 12, and any surface layers desired in a composite wafer 14, and any epitaxial nucleating layers, can be deposited by any convenient technique. I expect that they can be produced by at least one of a variety of growth techniques, including molecular beam epitaxy (MBE), metal organic chemical vapor deposition (MOCVD), vapor phase epitaxy (VPE), liquid phase epitaxy (LPE), metal organic magnetron sputtering (MOMS), and still other deposition techniques. The particular substrate and layer compositions chosen may determine which of the growth processes is optimal for that particular combination. I prefer MBE, and to a lesser extent, MOMS, in growing these device structures, because of their ease in incorporating aluminum into indium antimonide, and because of the ease of controlling layer thicknesses, compositions and doping. For example, it is characteristic of VPE that it is difficult to introduce aluminum into the growth layer.

As indicated above, layer 12 should have a higher energy band gap than layer 10, but still be substantially lattice matched. It can be seen in connection with FIG. 4 that aluminum antimonide has significantly higher energy band gap than indium antimonide but also a significantly lower lattice constant. Hence, aluminum antimonide inherently has a much higher intrinsic resistivity at room temperature than indium antimonide. This invention recognizes that even small additions of aluminum to indium antimonide can significantly increase the energy band gap of indium antimonide. This invention further recognizes that such small additions do not change the lattice constant of indium antimonide very much. Still further, this invention recognizes that such small additions can be quite significant if the thickness of buffer layer 12 is kept low. The result is the high sheet resistance needed to provide a sensor of high sensitivity. On the other hand, the thickness of layer 12 has to be large enough to present a high enough crystal quality on its upper surface to grow thin layers of indium antimonide of high mobility. Gallium additions to indium antimonide might be considered equal in providing a thin buffer layer upon which a thin active layer of high mobility can be grown. I now have found that gallium is not equal in its performance to aluminum in this application.

Figure 2:
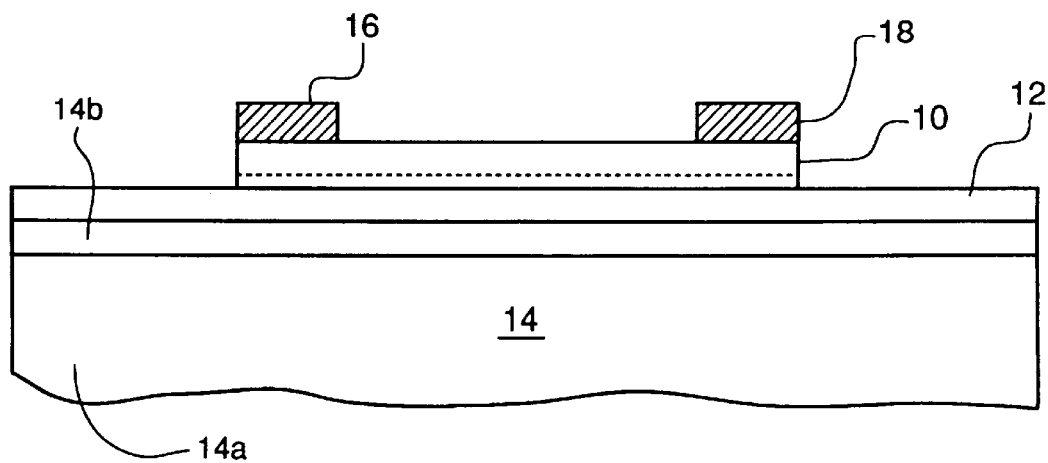
FIG. 2 shows a diagrammatic sectional view of an alternative magnetoresistor structure made in accordance with this invention.

The concept of using a composite wafer material to form substrate 14 has been hereinbefore described. Such a wafer is shown in FIG. 2. FIG. 2 shows a magnetic field sensor that is made on an elemental semiconductor wafer 14a, such as of silicon or germanium. Covering wafer 14a is an epitaxial layer 14b of higher energy band gap material. Wafer 14a and its covering layer 14b, together form a composite wafer 14. Wafer surface layer 14b is of a lattice constant intermediate that of the material of wafer 14a and buffer layer 12, as for example gallium arsenide (GaAs). As indicated above, when such a composite wafer is used, one may not choose to include the initial layer 19 of FIG. 1, the simplify the construction and reduce cost. Buffer layer 12, is similar to layer 12 in FIG. 1. However, if highest mobilities are singularly important, one may elect to use the initial layer 19 of FIG. 1 even with a composite wafer. Active layer 10 is the same as active layer 10 in FIG. 1. The right and left opposite edges of the rectangular mesa 10 have metal electrodes 16 and 18 formed thereon, similar to what is shown for FIG. 1. The dimensions of the rectangular area of layer 10 ordinarily are a subject of design compromise. However, generally speaking, the length of rectangular sides under electrodes 16 and 18 are generally longer than the other two sides of the rectangular area 10. Some of the principles involving dimensions of such rectangular areas and for methods of forming a plurality of serially connected but integrated areas of this type are described in U.S. Pat. No. 4,926,154, whose inventors include the inventor named in this patent application. That disclosure is incorporated herein by reference. In substance, U.S. Pat. No. 4,926,154 discloses forming a magnetically active blanket semiconductor layer on a substrate photolithographically delineating that layer into a mesa on the substrate and then metallizing the mesa. The mesa is metallized by blanket depositing an appropriate metal coating, as for example, gold or gold-germanium alloy or gold/platinum/titanium, on the entire surface of the mesa and the wafer, and then photolithographically delineating terminals on the mesa ends. Alternatively, a standard photolithographic lift-off process can be used to define the regions where the metal coatings remain. U.S. Pat. No. 4,926,154 further describes forming an integrated serially-connected multiplicity of rectangular areas by simply forming transverse "shorting bars" that extend across the mesa. All of the foregoing is also applicable to FIG. 1, as well.

In order to obtain a high sensor resistance, it has been the practice to use an elongated mesa, in which many rectangular sensing units are serially integrated. In order to obtain the maximum length of mesa in a given unit area, it is usually made in a "U-shape" or in a sinuous shape, frequently both. Such a sinuous "U-shape" is shown in FIG. 3A.

Figure 3A:
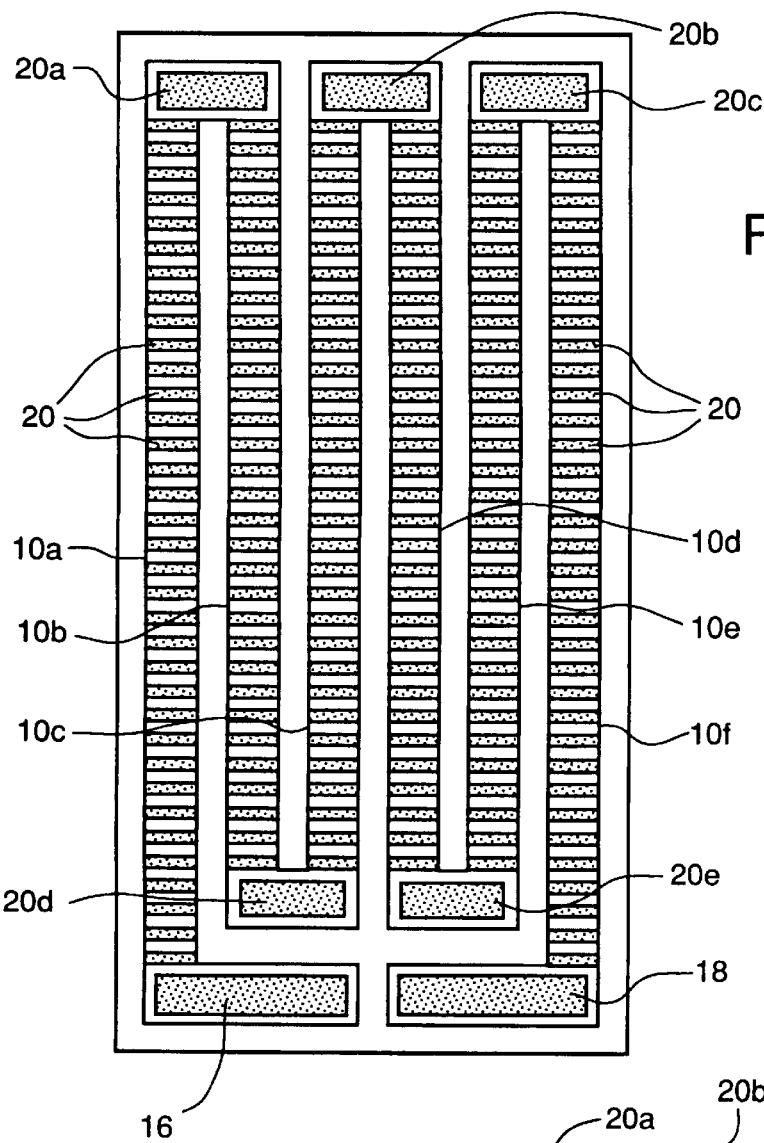
FIG. 3A shows a diagrammatic plan view of an integrated magnetoresistor sensor of given resistance and sensitivity made in accordance with the prior art.

Both the plan view and the compositions of FIG. 3A are representative of the prior art. For example, FIG. 3A shows a rectangular monocrystalline gallium arsenide or indium phosphide wafer, on which are disposed six discrete linear and parallel mesas 10a, 10b, 10c, 10d, 10e, and 10f. Mesas 10a–10f are of thin films of indium antimonide (InSb) that is doped n-type to generally stabilize its conductivity against change with temperature change. Each of the mesas 10a–10f has a plurality of shorting bars 20 on its surface, with opposite ends of each shorting bar overlapping onto the adjacent surface of the wafer. The shorting bars 20 divide each elongated mesa into a plurality of successive serially-connected, integral rectangular magnetically sensitive areas.

The lower end of mesa 10a is overlapped by metal electrode 16. The lower end of mesa 10f is overlapped by metal electrode 18. The upper ends of mesas 10a and 10b are overlapped by enlarged metal shorting bar 20a. The upper ends of mesas 10c and 10d are overlapped by enlarged metal shorting bar 20b. The upper ends of mesas 10e and 10f are overlapped by enlarged metal shorting bar 20c. The lower ends of the shorter mesas 10b and 10c are overlapped by a lower metal enlarged shorting bar 20d. Analogously, the lower ends of the shorter mesas 10d and 10e are overlapped by the lower enlarged metal shorting bar 20e.

Figure 3B:
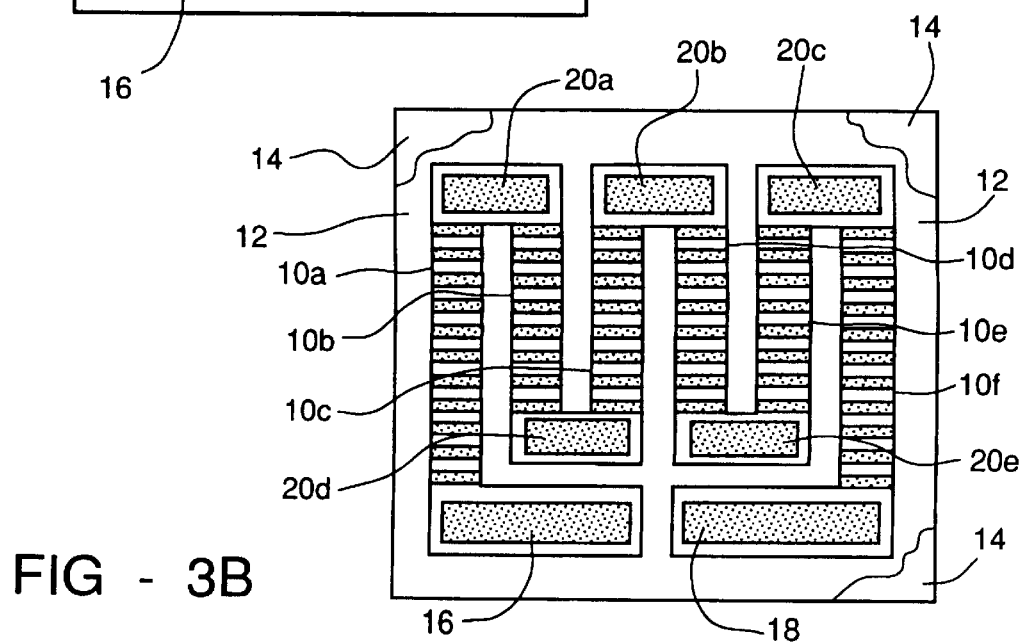
FIG. 3B shows a diagrammatic plan view of an integrated magnetoresistor sensor of the given resistance and sensitivity but made in accordance with this invention.

FIG. 3B shows a rectangular monocrystalline gallium arsenide or indium phosphide wafer 14 having a monocrystalline surface mesa 12 thereon of $In_{1-x}Al_xSb$ where "x" is 0.01–0.2 and perhaps more, preferably 0.03–0.15, and has thickness of about 0.03–1.0 micrometer, preferably about 0.1–0.5 micrometer, as hereinbefore described. Disposed on mesa layer 12 are monocrystalline thin film mesas 10a–10f consisting essentially of InSb. Mesas 10a–10f have shorting bars 20a–20e, as in FIG. 3A. FIG. 3B shows mesas 10a–10f as being decidedly shorter than mesas 10a–10f of FIG. 3A. Mesa layer 12 thus spaces substrate 14 from mesas 10a–10f.

Mesas 10A–10F of FIG. 3A are about three-four times longer than the length of mesas 10A–10F in FIG. 3B. The reason for this is that the FIG. 3A magnetoresistor is not made in accordance with this invention. In FIG. 3B, mesas 10A–10F have a thickness of only up to about 0.6 micrometer. The mesas 10A–10F in FIG. 3A have a thickness of about 2–5 micrometers. The significant thickness reduction in the mesas 10a–10f of FIG. 3B, combined with the special buffer underlayer 12 (mesa layer 12) on wafer 14, permits one to reduce the length of the mesas (over the length in FIG. 3A), and still obtain the same or even higher resistance between contacts 16 and 18, which form magnetoresistor terminals. This comparison in FIGS. 3A and 3B is shown to graphically illustrate that reduced power dissipation is not the only benefit achievable in this invention. One can also use the principles of this invention to make a smaller sensor, which can lower cost. In addition, the smaller sensor permits a higher spatial resolution to be obtainable with a sensor of the same or even higher total sensor resistance. The result is a higher spatial resolution sensor of the same or lower power consumption.

Note that attainment of sheet resistance in this invention, which is substantially larger than that previously attained in magnetoresistors with comparable doping and electron mobility, means that the use of a sinuous or meander path for the mesa in FIGS. 3A or 3B is more optional. Due to the shorter length of indium antimonide required to attain a given resistance, it is now more feasible to use a single, straight mesa, which can run parallel to the chip edges or be tilted at an angle to slightly increase its length (from one corner of the chip to an opposite corner, as in U.S. Pat. No. 5,491,461 Partin et. al., previously referenced). This has the benefit that it greatly increases the spatial resolution with which changes in magnetic field can be measured in the direction perpendicular to the long dimension of the magnetoresistor. Also, if the magnetoresistor is grown on a silicon substrate, the leakage currents through the substrate, which are in parallel with the layers 12 and 10, cannot take a shorter path between adjacent parts of a sinuous mesa. Alternatively, use of a straight mesa can facilitate integrating arrays of two or more magnetoresistors onto a single substrate.

Reference is again made to FIG. 4. More specifically, it can be seen from FIG. 4 that none of the compound semiconductors listed have lattice constants as large as that of indium antimonide. On the other hand, it can also be seen that $In_{1-x}Al_xSb$ can be lattice-matched to InSb. It can also be seen that $In_{1-x}Al_xSb$ has an energy band gap that rises very rapidly with increasing values of "x". This makes $In_{1-x}Al_xSb$ have a higher intrinsic resistivity than that of InSb. I take advantage of this increased resistivity, and can even make resistivity of the $In_{1-x}Al_xSb$ even higher by doping it with a deep impurity. Alternatively, $In_{1-x}Al_xSb$ may be doped p-type to increase its resistivity (instead of or in addition to doping it with a deep impurity), since holes have a much a lower mobility (than electrons) in an indium antimonide-rich composition. Further, as indicated above, if the film of $In_{1-x}Al_xSb$ buffer layer is kept thin, sheet resistance of the film can be maximized. The p-type dopants that may be used include beryllium, zinc, cadmium, magnesium, manganese, and possibly some Group IV elements such as germanium, depending upon growth technique. Of these, I prefer manganese, which has much lower toxicity than beryllium and which I find has a relatively low diffusion coefficient in indium aluminum antimonide and good dopant activation.

It should also be mentioned that in some applications, higher resistance sensors may be more important than sensors of the highest sensitivity. Accordingly, raising the energy band gap of the layer 12 semiconductor may be more important than having it very closely match the lattice constant of the semiconductor material forming active layer 10. In such an instance, one may choose to use higher values of "x" in $In_{1-x}Al_xSb$ than otherwise, such as values of "x" around 0.3. However, the aluminum mole fraction in layer 12 is in all cases subject to the constraints that the lattice constant of layer 12 is larger than 6.3 angstroms and its energy band gap is smaller than that of the substrate wafer 14. Furthermore, aluminum antimonide mole fractions in layer 12 above about 20% cause larger lattice mismatch between layers 12 and 10 and therefore lower electron mobilities in layer 10. For example, for a sample study in which the substrate 14 was an indium phosphide wafer, layer 12 was a 0.25 micrometer thick indium aluminum antimonide layer with "x"=0.35 and doped p-type with manganese, and layer 10 was indium antimonide was undoped for the first 0.10 micrometer, doped (with tellurium at about $1\times10^{17}$ $cm^{-3}$) for the next 0.40 micrometer, and the tellurium concentration was graded up to $5\times10^{17}$ $cm^{-3}$ in the last 0.05 micrometers, the electron mobility at 200 degrees Centigrade in the sample study was about 27,000 $cm^2V^{-1}s^{-1}$. Comparable films with "x" in the range of 0.04 to 0.15 had electron mobilities of at least about 30,000 $cm^2V^{-1}s^{-1}$ at 200 degrees Centigrade and over 40,000 $cm^2V^{-1}s^{-1}$ at room temperature. I refer to layers 12 with more than about 20% aluminum antimonide mole fraction (but having a lattice constant greater than about 6.3 angstroms) as being only "roughly" lattice matched to active layer 10, which consists essentially of indium antimonide.

Layers 10 and 12 are shown as discrete layers. However, the composition of layer 12 could be graded in its upper portions to gradually delete aluminum and increase indium to the 50/50 molar ratio of layer 10. It should also be recognized that enhanced magnetic sensitivity may be obtained if the initially deposited portion of layer 10 (shown below the dotted line in FIG. 1) is intrinsic, i.e., not doped n-type, as indicated above.

As indicated above, a conventional n-type dopant is tellurium, selenium, sulfur, silicon, tin or the like. Other dopants may be used in layer 10 besides the conventional donor impurities. A rare earth dopant, such as erbium, may be used, which is disclosed in U.S. Pat. No. 5,314,547, of which D. L. Partin was one of the inventors. These dopants are interesting because their presence in indium antimonide can stabilize the electron mobility against temperature variations. In general, I have found that the doping efficiency of rare earth elements in indium antimonide is low, typically less than 10%. Therefore, it is necessary to use rather high levels of them to obtain an electron density of about $1\times10^{17}$ $cm^{-3}$. As described in U.S. Pat. No. 5,314,547, it is advantageous to periodically dope indium antimonide with a rare earth element to as to form a doping superlattice, sometimes referred to as a nini structure. It is also possible to further optimize the lack of dependence of electron mobility on temperature by doping with a rare earth element and with a conventional donor impurity such as tellurium, selenium, sulfur, silicon, etc. Iron group elements or transition elements are also of interest and were mentioned in U.S. Pat. No. 5,314,547, due to their appreciable magnetic moments. Many of these act as acceptors, however, and this means that if very much of one of them is used to dope layer 10, an additional donor dopant, is needed, such as the conventional Group VI dopants.

There are some more general features of this invention which may be mentioned. While the emphasis here has been on magnetoresistors, there is a general applicability to Hall effect sensors and MAGFETS and magnetoresistors of other geometries. The differences generally involve simple differences in layout of the mesa and the contacts to it, as is well known in the art. Arrays of magnetoresistors, Hall effect sensors, or MAGFETS can also be used in some applications, either as hybrid circuits involving discrete sensors or as magnetic field sensors which are integrated on a single substrate. While the emphasis here has been on the epitaxial structures used and on the mesa and ohmic contact structures, more is commonly done to make a complete sensor. For example, a passivation layer is generally applied to the surface of the device to protect the active portions of it. Mainly only wire bonding pads on the metallization are left exposed. This passivation make consist of silicon dioxide, silicon nitride, photoresist, polyimide or another polymer, etc. A completed chip is generally bonded to a stable support, which may be the surface of a magnet, lead frame, ferromagnetic layer, etc., using an epoxy or other normal means. It is connected to an electrical interface circuit via wire bonds or other electrical connections to the chip metallization. A potting compound may then be used to overmold the chip and give it greater protection. A magnetic circuit is then provided which is to be sensed, either involving permanent magnets, electromagnets, motor windings, the earth's magnetic field, etc. There are a number of variations on these things, but they are generally known in the art and are not unique to this invention.

The foregoing description shows that the preferred embodiments of the present invention are well-suited to fulfill the objects above stated. The foregoing detailed description recognizes that those skilled in the art may make various modifications or additions to the preferred embodiments described herein without departing from the spirit and proper scope of the invention. Accordingly, it has been understood that the protection sought and to be afforded hereby should be deemed to extend to the subject matter defined by the appended claims, including all fair equivalents thereof.

I claim:

1. A semiconductive magnetic field sensor having an active layer consisting essentially of pure indium antimonide and a buffer layer, said sensor comprising:

a substrate having a monocrystalline and at least semi-insulating surface region, said surface region being a crystal and having a lattice constant of at least 5.4 angstroms;

a first epitaxial semiconductor layer disposed on said substrate surface region, said first epitaxial layer being of a thickness of 0.1–0.5 micrometer and consisting essentially of the ternary semiconductor material $In_{1-x}Al_xSb$, where "x" is 0.01–0.2, said first epitaxial semiconductor layer having a crystal outer surface and a given sheet resistance, said $In_{1-x}Al_xSb$ ternary semiconductor material having a lattice constant of at least 6.41 angstroms and a given energy band gap;

a second epitaxial semiconductor layer disposed on said outer surface of said first epitaxial semiconductor layer, said second epitaxial semiconductor layer being an active layer 0.25–0.6 micrometer thick and consisting essentially of the binary semiconductor material InSb, said second epitaxial semiconductor layer having a sheet resistance less than one tenth that of the first epitaxial layer, said binary InSb semiconductor material having a lattice constant closely matching that of said ternary semiconductor $In_{1-x}Al_xSb$ but having a lower energy band gap, and also having an electron mobility of at least 35,000 $cm^2V^{-1}s^{-1}$ at room temperature;

said first epitaxial layer being a mesa of said ternary $In_{1-x}Al_xSb$ semiconductor material on said substrate surface region;

said second epitaxial layer being a mesa of said binary InSb semiconductor material superimposed on said first epitaxial layer; and electrical contacts on two or more spaced surface areas of said second epitaxial layer.

2. The magnetic field sensor as defined in claim 1 wherein the substrate is a composite wafer that has a monocrystalline gallium antimonide buffer layer on its surface, said buffer layer being a mesa disposed between said substrate and said first epitaxial layer and covering the same region of said substrate surface as said first and second epitaxial layers.

3. The magnetic field sensor as defined in claim 1 wherein the first and second epitaxial layers have an interface and said layers have a composition gradient at and perpendicular to said interface, where aluminum content decreases and indium content correspondingly increases in said first epitaxial layer approaching said interface.

4. The magnetic field sensor as defined in claim 1 wherein the substrate is a wafer of monocrystalline semiconductor material selected from the group consisting of gallium arsenide and indium phosphide.

5. The magnetic field sensor as defined in claim 1 wherein the substrate is a composite wafer that has a deposition surface of monocrystalline semiconductor material.

6. The magnetic field sensor as defined in claim 5 wherein the monocrystalline semiconductor material is a compound semiconductor having a monocrystalline lattice constant at least 5.65.

7. The magnetic field sensor as defined in claim 5 wherein the deposition surface is of a compound semiconductor material of at least three elements.

8. The magnetic field sensor as defined in claim 1 wherein the magnetic field sensor is a magnetoresistor, and the first and second epitaxial layers have lattice constants that differ by less than 0.07 angstrom.

9. The magnetic field sensor as defined in claim 1 wherein "x" is 0.03–0.15.

10. The magnetic field sensor of claim 9 wherein the first epitaxial layer has at least one doping selected from the group consisting of a deep level doping and a p-type doping, to increase its sheet resistance.

11. The magnetic field sensor as defined in claim 10 wherein:

the first and second epitaxial layers have an interface and said layers have a composition gradient at and perpendicular to said interface, where aluminum content decreases and indium content correspondingly increases in said first epitaxial layer approaching said interface;

the second epitaxial layer is doped n-type through at least a portion of its thickness; and the n-type dopant is tellurium, selenium, sulfur, silicon, or another conventional donor impurity for indium antimonide.

12. The magnetic field sensor as defined in claim 11 wherein:

the second epitaxial layer is doped with at least one member selected from the group consisting of an iron group element, a Group IV element, a Group VI element, and a rare earth element.

13. The magnetic field sensor as defined in claim 12 wherein the second epitaxial layer:

is undoped in layer portions closest to said first epitaxial layer;

is doped n-type throughout other portions of its thickness; and said other portions of said second epitaxial layer that lie adjacent a major surface of said second epitaxial layer opposite from said first epitaxial layer are more heavily doped n-type than the balance of said other portions.

14. The magnetic field sensor as defined in claim 13 wherein;

said other portions of said second epitaxial layer are doped with a rare earth element and with a conventional donor impurity selected from the group consisting of tellurium, selenium, sulfur, or silicon; and said the n-type dopant in said other portions is in a concentration of $4 \times 10^{16}$ to $2 \times 10^{17}$ atoms/cm$^3$.

15. A high magnetic sensitivity compound semiconductor magnetic field sensor comprising:

a monocrystalline substrate of a semiconductor selected from the class consisting of silicon, germanium, gallium arsenide, and indium phosphide, said substrate having a semi-insulating monocrystalline surface portion that has a lattice constant of at least 5.9 angstroms;

a first epitaxial layer of given sheet resistance disposed on said substrate surface portion of a ternary compound semiconductor consisting essentially of $In_{1-x}Al_xSb$, where "x" is 0.01–0.2, said layer being 0.1–0.5 micrometer thick and having an exposed surface with a dislocation density less than $3 \times 10^9$ cm$^{-2}$, said first compound semiconductor having a lattice constant of at least 6.41 angstroms and an energy band gap of at least 0.2 Ev at room temperature and less than the energy band gap of the substrate;

a second epitaxial layer disposed on said exposed surface of said first epitaxial layer, said second epitaxial layer having an exposed surface and a thickness of 0.25–0.6 micrometer and being of a binary compound semiconductor consisting essentially of InSb, said compound semiconductor in said second epitaxial layer having a lattice constant substantially matching that of said ternary compound semiconductor material in said first epitaxial layer, also having an electron mobility of at least 30,000 cm$^2$V$^{-1}$s$^{-1}$ at room temperature, and further having a sheet resistance smaller than one tenth the sheet resistance of said first epitaxial layer;

said first and second epitaxial layers forming superimposed mesas having congruent peripheries on said surface portion of said substrate; and electrical contacts on said second epitaxial layer.

16. The magnetic field sensor as defined in claim 15 wherein "x" is 0.03–0.15, and said surface portion on said substrate comprises a layer consisting essentially of gallium antimonide that is a congruent mesa disposed between said first epitaxial layer and said wafer.

17. The magnetic field sensor as defined in claim 15 wherein:

said first epitaxial layer is doped p-type;

the said gallium antimonide layer is 0.02–0.3 micrometer thick, is p-type and has a sheet resistance which is much larger than the said sheet resistance of said second epitaxial layer;

said electron mobility of said second epitaxial layer is at least 35,000 cm$^2$V$^{-1}$s$^{-1}$ at room temperature; and said second epitaxial layer is doped n-type within a factor of 10 of $3 \times 10^{17}$ cm$^{-3}$ over at least 40% of its thickness.

* * * * *